(12) United States Patent
Kunii et al.

(10) Patent No.: US 7,059,476 B2
(45) Date of Patent: Jun. 13, 2006

(54) TRAY FOR ELECTRONIC PARTS

(75) Inventors: Hisayoshi Kunii, Sagamihara (JP); Koji Koga, Yokohama (JP); Reikichi Hatori, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 497 days.

(21) Appl. No.: 10/420,846

(22) Filed: Apr. 23, 2003

(65) Prior Publication Data

US 2003/0209466 A1 Nov. 13, 2003

Related U.S. Application Data

(62) Division of application No. 09/805,172, filed on Mar. 14, 2001, now abandoned.

(30) Foreign Application Priority Data

Mar. 16, 2000 (JP) ................................ 2000-74238

(51) Int. Cl.
*B65D 85/86* (2006.01)

(52) U.S. Cl. ...................... 206/725; 206/503; 206/509; 206/557; 206/561; 206/562; 206/563; 206/564; 206/565; 206/701; 206/706; 206/710; 206/712; 206/832; 220/380; 220/631

(58) Field of Classification Search ................ 206/701, 206/706, 710, 712, 725, 503–509, 557, 561, 206/562, 564, 565, 832; 220/379, 380, 631, 220/636
See application file for complete search history.

(56) References Cited

U.S. PATENT DOCUMENTS 4,425,997 A * 1/1984 Grant ........................ 206/0.84

| D292,743 | S | * | 11/1987 | Hung | D3/315 |
| 5,110,001 | A | * | 5/1992 | Dunn | 294/33 |
| 5,310,076 | A | * | 5/1994 | Burton et al. | 220/377 |
| 5,400,904 | A | * | 3/1995 | Maston et al. | 206/725 |
| 5,418,692 | A | * | 5/1995 | Nemoto | 361/809 |
| 5,551,572 | A | * | 9/1996 | Nemoto | 206/725 |
| 5,634,559 | A | | 6/1997 | Foos et al. | |
| 5,794,783 | A | | 8/1998 | Carter | |
| 5,848,703 | A | * | 12/1998 | Murphy et al. | 206/725 |
| 5,957,293 | A | * | 9/1999 | Pakeriasamy | 206/725 |
| 6,079,565 | A | * | 6/2000 | Walsh et al. | 206/725 |
| 6,116,427 | A | * | 9/2000 | Wu et al. | 206/706 |

(Continued)

FOREIGN PATENT DOCUMENTS

TW 243546 3/1995

(Continued)

*Primary Examiner*—Mickey Yu
*Assistant Examiner*—Steven Pollicoff
(74) *Attorney, Agent, or Firm*—Finnegan, Henderson, Farabow, Garrett & Dunner, L.L.P.

(57) ABSTRACT

A first construction of a tray for electronic parts according to the present invention is provided with an engaging cut-out corner portion which is formed by cutting a corner portion of a table-like flat portion which is arranged diagonally with respect to a-cut-out corner portion. A second construction of a tray for electronic parts according to the present invention is provided with a pawl engaging protruding portion which is formed on a step-like peripheral edge portion above a cut-out portion. In a third construction of a tray for electronic parts according to the present invention, when two trays are stacked up so that the top faces thereof face each other, an engaging first-shaped protrusion which is formed around a predetermined pocket of one tray engages an engaging second-shaped protrusion which is formed around a predetermined pocket of the other tray.

4 Claims, 6 Drawing Sheets

U.S. PATENT DOCUMENTS

| | | | |
|---|---|---|---|
| 6,149,010 A * | 11/2000 | Tanaka et al. | 206/714 |
| 6,202,883 B1 * | 3/2001 | Narazaki et al. | 220/507 |
| 6,227,372 B1 * | 5/2001 | Thomas et al. | 206/725 |
| 6,230,896 B1 * | 5/2001 | Lambert | 206/722 |
| 6,296,122 B1 * | 10/2001 | Nakazono et al. | 206/707 |
| 6,349,832 B1 * | 2/2002 | Han | 206/724 |
| 6,357,595 B1 * | 3/2002 | Sembonmatsu et al. | 206/726 |
| 6,384,361 B1 * | 5/2002 | Vijaykumar | 209/573 |
| 6,612,442 B1 * | 9/2003 | Soh et al. | 206/725 |
| 6,857,524 B1 * | 2/2005 | Duban-Hu et al. | 206/725 |
| 6,868,970 B1 * | 3/2005 | Gardiner et al. | 206/725 |
| 6,907,993 B1 * | 6/2005 | Wang | 206/725 |
| 6,914,771 B1 * | 7/2005 | Ono et al. | 361/679 |

FOREIGN PATENT DOCUMENTS

| | | |
|---|---|---|
| TW | 352710 | 2/1999 |

* cited by examiner

TRAY FOR ELECTRONIC PARTS

CROSS REFERENCE TO RELATED APPLICATIONS

This application is a divisional of now abandoned application Ser. No. 09/805,172 filed Mar. 14, 2001 which is herein incorporated by referance.

The subject application is also related to subject matter disclosed in Japanese Patent Application No. 2000-74238 filed on Mar. 16, 2000 in Japan to which the subject application claims priority under Paris Convention and which is incorporated herein by reference.

BACKGROUND OF THE INVENTION

1. Field of the Invention

The present invention relates generally to a tray for electronic parts. More specifically, the invention relates to a tray used for carrying and inspecting electronic parts, such as semiconductor devices, each of which has ball terminals on its package bottom.

2. Related Background Art

Figure 1:
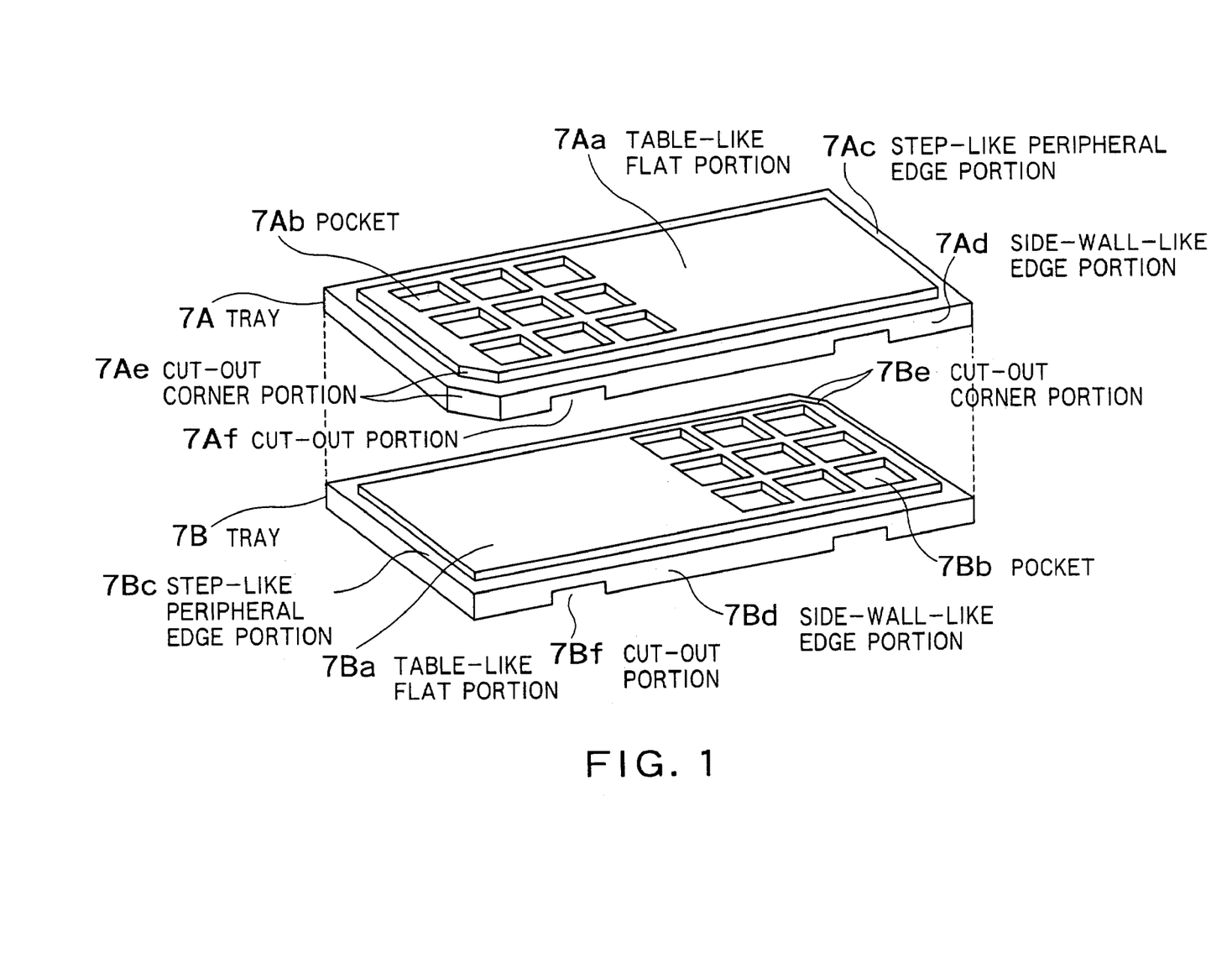
FIG. 1 is a perspective view of the appearance of conventional trays for electronic parts.

FIG. 1 is a perspective view showing the appearance of a conventional tray for electronic parts.

FIG. 1 shows first and second conventional trays 7A and 7B for electronic parts. The two conventional trays for electronic parts are shown in order to explain conventional problems which will be described later. Since the first and second conventional trays 7A and 7B for electronic parts have the same structure, the structure of the first conventional tray 7A for electronic parts will be described below.

The conventional tray 7A for electronic parts comprises: a substantially rectangular table-like flat portion 7Aa constituting a principal portion of the tray; a plurality of pockets 7Ab, each of which comprises a recessed portion formed in the table-like flat portion 7Aa so as to be adapted to the size of a corresponding one of electronic parts to be housed therein and which are arranged in the form of a matrix; a step-like peripheral edge portion 7Ac which is formed on the peripheral edge portion of the table-like flat portion 7Aa so as to allow a plurality of trays to be sequentially engaged with each other to be stacked up; a side-wall-like edge portion 7Ad which is formed on the bottom side of the step-like peripheral edge portion 7Ac so as to support thereon the table-like flat portion 7Aa and the step-like peripheral edge portion 7Ac; cut-out portions 7Af which are formed by cutting out part of the side-wall-like edge portion 7Ad so as to engage the carrying pawls of a carrying mechanism for carrying the tray; and a cut-out corner portion 7Ae which is formed by cutting out one of four corner portions of each of the table-like flat portion 7Aa and step-like peripheral edge portion 7Ac in order to align the respective trays when the plurality of trays are sequentially engaged with each other to be stacked up.

This conventional tray 7A for electronic parts is used for housing electronic parts, such as semiconductor devices, each of which has ball terminals on its package bottom, to carry and inspect the electronic parts. In order to avoid damage to the ball terminals on the bottom of the package of electronic parts, a through hole for exposing the ball terminals to the reverse surface side of the tray is formed in the central portion of the bottom of each of the pockets 7Ab so that the peripheral edge portion of the bottom of the package of electronic parts is supported on the peripheral edge portion of the bottom of each of the pockets 7Ab. The conventional tray 7A for electronic parts is produced by injection-molding a plastic material or the like.

Figure 2:
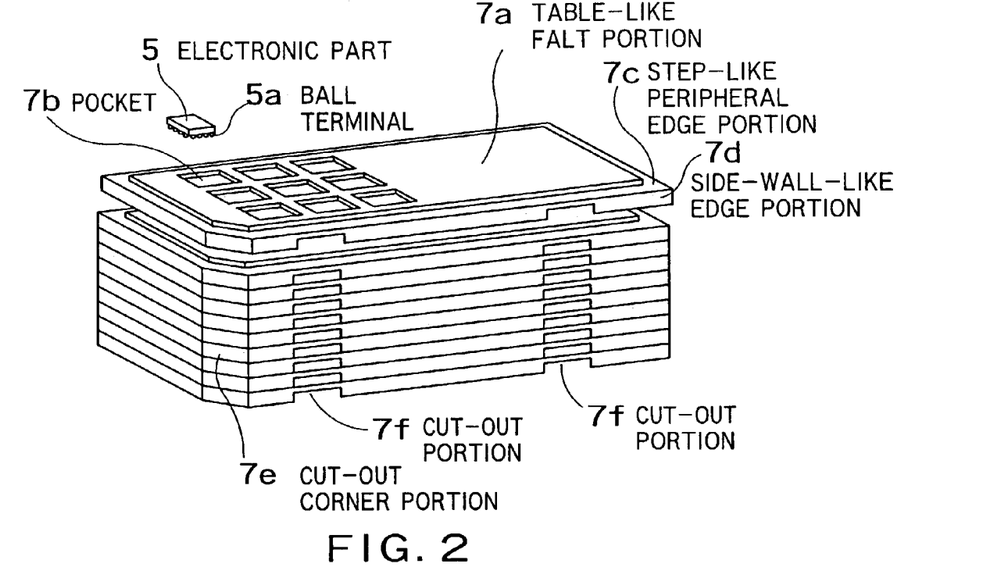
FIG. 2 is a perspective view showing a state that a plurality of conventional trays for electronic parts are sequentially engaged with each other to be stacked up.

FIG. 2 is a perspective view showing a state that a plurality of conventional trays for electronic parts are sequentially engaged with each other to be stacked up.

In FIG. 2, the plurality of trays are not particularly distinguished from each other, so that the respective portions of each of the trays are expressed by common reference symbols, such as a table-like flat portion 7a, pockets 7b, a step-like peripheral edge portion 7c, a side-wall-like edge portion 7d, cut-out portions 7f and a cut-out corner portion 7e.

In order to collectively carry the plurality of conventional trays for electronic parts, the trays are carried in a state that the trays are sequentially engaged with each other to be stacked up as shown in FIG. 2.

In FIG. 1, the first and second conventional trays 7A and 7B for electronic parts are shown in opposite directions to each other in order to explain conventional problems which will be described later. In order to normally stack the plurality of trays, after the directions of the respective trays are coincident with each other so that the cut-out portions 7e of the respective trays are arranged in vertical directions, the respective trays are sequentially engaged with each other to be stacked up as shown in FIG. 2.

The electronic parts 5, each of which has the ball terminals 5a on its package bottom, are housed in the respective pockets so that the ball terminals 5a are directed toward the bottom of the tray.

Figure 3A:
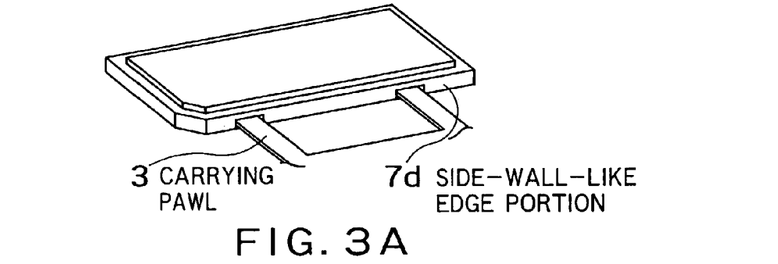
FIGS. 3A and 3B are perspective views showing states that a conventional tray for electronic parts is carried by means of a carrying mechanism.
Figure 3B:
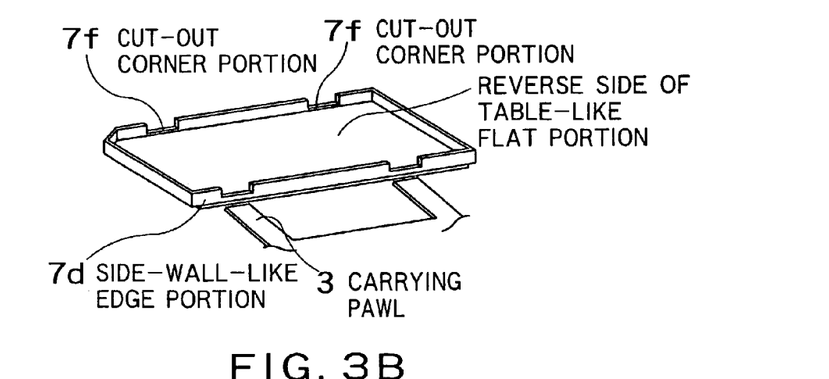

FIGS. 3A and 3B are perspective views showing states that the conventional tray for electronic parts is carried by a carrying mechanism.

As shown in FIG. 3A, the conventional tray for electronic parts is carried by engaging the carrying pawls 3 of the carrying mechanism with the cut-out portions 7f formed in the sidewall-like edge portion 7d of the tray. Referring to FIG. 3B, conventional problems will be described later.

Figure 4:
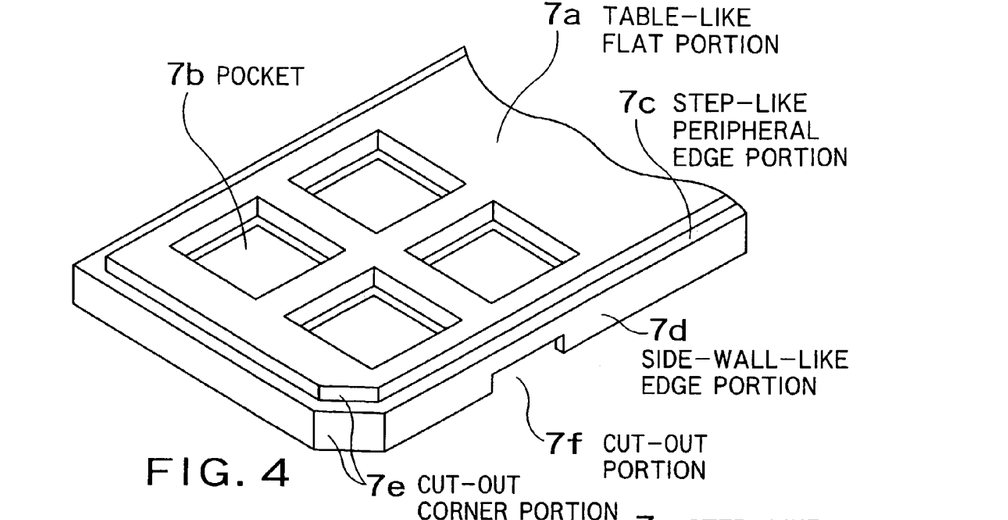
FIG. 4 is an enlarged perspective view of a part of the appearance of the conventional tray for electronic parts shown in FIG. 1.

FIG. 4 is an enlarged perspective view of a part of the appearance of the conventional tray for electronic parts shown in FIG. 1. The construction of the conventional tray for electronic parts has been described above referring to FIG. 1.

In FIG. 4, the respective portions of the tray are expressed by common reference symbols, such as a table-like flat portion 7a, pockets 7b, a step-like peripheral edge portion 7c, a side-wall-like edge portion 7d, cut-out portions 7f and a cut-out corner portion 7e.

Figure 5:
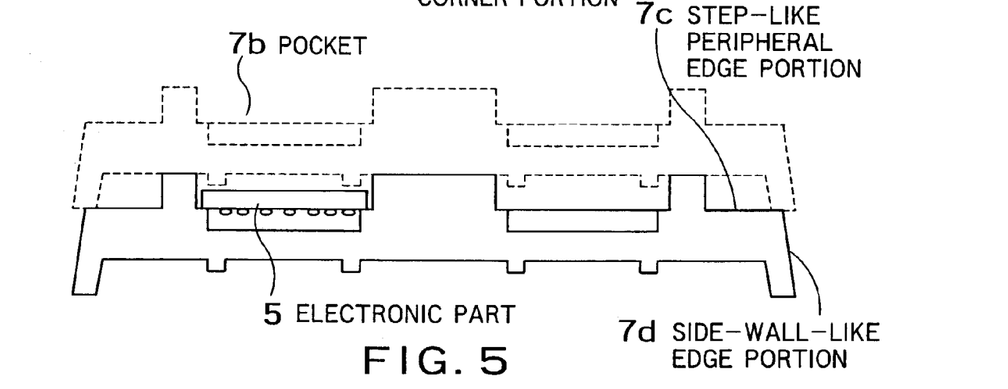
FIG. 5 is a sectional view showing a state that a plurality of conventional trays for electronic parts, in which electronic parts have been housed, are sequentially engaged with each other to be stacked up.

FIG. 5 is a sectional view showing a state that a plurality of conventional trays in which electronic parts are housed therein are sequentially engaged with each other to be stacked up.

As described above referring to FIG. 2, the electronic parts 5, each of which has the ball terminals 5a on its package bottom, are housed in the respective pockets so that the ball terminals 5a are directed toward the bottom of the tray. The respective trays are sequentially engaged with each other to be stacked up so that the side-wall-like edge portion 7d of each tray is mounted on the step-like peripheral edge portion 7c of a tray which is arranged directly below each tray. As shown in FIGS. 5 and 2, the plurality of conventional trays for electronic parts are carried in a state that the plurality of trays are sequentially engaged with each other to be stacked up.

Figure 6:
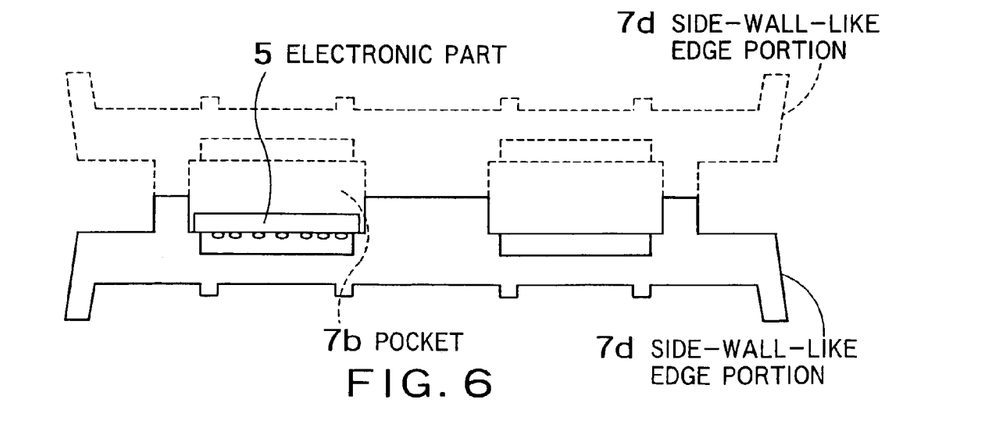
FIG. 6 is a sectional view showing a state that two conventional trays for electronic parts are stacked up so that their table-like flat portions 7a face each other.

FIG. 6 is a sectional view showing a state that two conventional trays for electronic parts are stacked up so that the table-like flat portions 7a of the trays face each other in order to reverse electronic parts when the electronic parts housed in the conventional tray for electronic parts are inspected from the reverse side.

When the electronic parts housed in the tray are inspected from the reverse side, it is required to reverse the electronic parts. Although some methods for reversing the electronic parts are considered, the electronic parts must be repacked so that the top face of the package of the electronic parts is directed downwards when the electronic parts are reversed while the top face of the tray is directed upwards. However, in this method, it takes a lot of time to repack the electronic parts, and the electronic parts are often damaged by a miss operation.

Therefore, as one method for reversing electronic parts, there is adopted a method for reversing electronic parts, which have been housed in the respective pockets 7b, to move the electronic parts from one tray, in which the electronic parts have been housed, to the other empty tray at a time by reversing the two trays at the same time in a state that the other empty tray is stacked on the one tray so that the top face of the other empty tray faces the top face of the one tray as shown in FIG. 6.

However, in the above described conventional tray for electronic parts, there are various problems as follows.

First, as shown in FIG. 1, the first and second trays 7A and 7B for electronic parts serving to the two conventional trays for electronic parts are provided with the cut-out corner portions 7Ae and 7Be, respectively, in order to align the respective trays.

However, if both trays are directed in opposite directions by mistake to be engaged with each other to be stacked up in a state that the cut-out corner portions 7Ae and 7Be are not arranged in vertical directions, there are problems in that both trays are not correctly engaged with each other due to the existence of the cut-out corner portions 7Ae and 7Be, to damage the side-wall-like edge portions 7Ad and 7Bd of both trays and/or to cause both trays to warp.

As described above, when the electronic parts housed in the tray are inspected from the reverse side, it is required to reverse the electronic parts. Therefore, as shown in FIG. 6, there is adopted a method for reversing electronic parts by reversing two trays in a state that the two trays are stacked up so that their top faces face each other.

However, in this method, the top faces of the two trays face each other, so that the depth of each of the pockets 7b is doubled to be twice or more as large as the height of each of the electronic parts. Therefore, there are some cases where the electronic parts remain being inclined in the pockets 7b when the two trays are reversed to reverse the electronic parts. As a result, there are problems in that the electronic parts are damaged and that it is determined that the electronic parts are not good since inspection can not normally be carried out although they are non-defective parts.

Therefore, in order to avoid the problems in the method for repacking electronic parts to reverse the electronic part and in the method for simultaneously reversing two trays while the top faces of the two trays face each other to be stacked, there is also another method for reversing electronic parts by simultaneously reversing a plurality of trays in a state that the trays are sequentially engaged with each other in the same direction to be stacked as shown in FIGS. 2 and 5. As shown in FIG. 5, in this method, the electronic parts are reversed in a state that the electronic parts are housed in the pockets 7b having a depth corresponding to the depth of each of the electronic parts. Therefore, the electronic parts are not inclined after reversal, and it does not take a lot of time unlike the method for repacking electronic parts.

However, when the electronic parts are inspected from the reverse side after all of the trays are reversed, the trays must be carried one by one while the trays are reversed as shown in FIG. 3B.

When the tray is carried without being reversed as shown in FIG. 3A, the cut-out portions 7f formed in the side-wall-like edge portion 7d can engage the carrying pawls 3 of the carrying mechanism to surely carry the tray. On the other hand, when the tray is carried while being reversed as shown in FIG. 3B, although the carrying pawls 3 engage the step-like peripheral edge portion 7c to carry the tray, there is no portion for engaging the carrying pawls 3 in a direction perpendicular to the carrying pawls 3, so that there is a problem in that there are some cases where the tray drops due to side slip while the tray is carried.

SUMMARY OF THE INVENTION

It is therefore an object of the present invention to provide a tray for electronic parts capable of solving the aforementioned problems in a case where a plurality of trays are engaged with each other to be stacked up, in a case where a tray is carried while being reversed, and in a case where electronic parts are reversed by simultaneously reversing two trays while the two trays are stacked up so that the top faces of the trays face each other.

According to a first construction of a tray for electronic parts according to the present invention, there is provided a tray for electronic parts, comprising: a substantially rectangular table-like flat portion constituting a principal portion of the tray; a plurality of pockets, each of which comprises a recessed portion formed in the table-like flat portion so as to be adapted to the size of a corresponding one of electronic parts to be housed therein and which are arranged in the form of a matrix; a step-like peripheral edge portion which is formed on the peripheral edge portion of the table-like flat portion so as to allow a plurality of trays to be sequentially engaged with each other to be stacked up; a side-wall-like edge portion which is formed on the bottom side of the step-like peripheral edge portion so as to support thereon the table-like flat portion and the step-like peripheral edge portion; a cut-out portion which is formed by cutting out a part of the side-wall-like edge portion so as to engage a carrying pawl of a carrying mechanism for carrying the tray; a cut-out corner portion which is formed by cutting out one of four corner portions of each of the table-like flat portion, the step-like peripheral edge portion and the side-wall-like peripheral edge portion in order to align the respective trays when the plurality of trays are sequentially engaged with each other to be stacked up; and an engaging cut-out corner portion which is formed by cutting out a corner portion of the table-like flat portion, which is arranged diagonally with respect to the cut-out corner portion, so as to allow the plurality of trays to be sequentially engaged with each other to be stacked even if the directions of the trays are opposite to each other in horizontal directions.

With this construction, it is possible to cause trays to engage even if the trays are directed in horizontal opposite directions when the trays are engaged with each other to be stacked, so that it is possible to prevent the side-wall-like edge portion of the tray from being damaged and to prevent the tray from warping.

According to a second construction of a tray for electronic parts according to the present invention, there is provided a tray for electronic parts, comprising: a substantially rectangular table-like flat portion constituting a principal portion of the tray; a plurality of pockets, each of which comprises a recessed portion formed in the table-like flat portion so as to be adapted to the size of a corresponding one of electronic parts to be housed therein and which are arranged in the form of a matrix; a step-like peripheral edge portion which is formed on the peripheral edge portion of the table-like flat portion so as to allow a plurality of trays to be sequentially engaged with each other to be stacked up; a side-wall-like edge portion which is formed on the bottom side of the step-like peripheral edge portion so as to support thereon the table-like flat portion and the step-like peripheral edge portion; a cut-out portion which is formed by cutting out a part of the side-wall-like edge portion so as to engage a carrying pawl of a carrying mechanism for carrying the tray; a cut-out corner portion which is formed by cutting out one of four corner portions of each of the table-like flat portion and the step-like peripheral edge portion in order to align the respective trays when the plurality of trays are sequentially engaged with each other to be stacked up; and a pawl engaging protruding portion which is formed on the surface of the step-like peripheral edge portion above the cut-out portion so as to be able to engage the carrying pawl of the carrying mechanism from the bottom side in a state that the trays are reversed.

With this construction, it is possible to surely carry a tray while being reversed, by causing the carrying pawls of a carrying mechanism to engage pawl engaging protruding portions, which are formed on the surface of a step-like peripheral edge portion at positions corresponding to cut-out portions, in a state that the tray is reversed, so that it is possible to prevent the tray from dropping due to side slip while the tray is carried in the state that the tray is reversed.

According to a third construction of a tray for electronic parts according to the present invention, there is provided a tray for electronic parts comprising: a substantially rectangular table-like flat portion constituting a principal portion of the tray; a plurality of pockets, each of which comprises a rectangular recessed portion formed in the table-like flat portion so as to be adapted to the size of a range occupied by ball terminals provided on the bottom of the package of electronic parts to be housed therein and which are arranged in the form of a matrix; a side-wall-like edge portion which is formed on the bottom side of the peripheral edge portion of the table-like flat portion so as to support thereon the peripheral edge portion of the table-like flat portion; a cut-out portion which is formed by cutting out a part of the side-wall-like edge portion so as to engage a carrying pawl of a carrying mechanism for carrying the tray; a cut-out corner portion which is formed by cutting out one of four corner portions of the table-like flat portion in order to align the respective trays when the plurality of trays are sequentially engaged with each other to be stacked up; engaging first-shaped protrusions, each of which has a first shape and which are formed around each of alternate pockets in row and column directions, of the plurality of pockets formed in the form of the matrix, so as to be adapted to the size of a corresponding one of the electronic parts to be housed; and engaging second-shaped protrusions, each of which has a second shape and which are formed around each of pockets, around which the engaging first-shaped protrusions are not provided, so as to be adapted to the size of a corresponding one of the electronic parts to be housed, so as to engage the engaging first-shaped protrusions when the table-like flat portion of the tray faces the table-like flat portion of another tray to be stacked up.

With this construction, when two trays stacked up to be engaged with each other are simultaneously reversed to reverse electronic parts, which have been housed in the respective pockets of one of the two trays, to move the electronic parts to the other empty tray of the two trays, it is possible to prevent the electronic parts from remaining being inclined in the pockets, so that it is possible to prevent the electronic parts from being damaged and to prevent defectives from being erroneously determined.

The engaging first-shaped protrusions may be engaging L-shaped protrusions which are formed on four corner portions surrounding each of alternate pockets in row and column directions, of the plurality of pockets formed in the form of the matrix, so as to be adapted to the size of a corresponding one of the electronic parts to be housed; and the engaging second-shaped protrusions may be engaging I-shaped protrusions which are formed at the central portion of each of four sides surrounding to pockets, around which the engaging L-shaped protrusions are not provided, to extend along the respective four sides and which are adapted to the size of a corresponding one of the electronic parts to be housed, so as to engage the engaging L-shaped protrusions when the table-like flat portion of the tray faces the table-like flat portion of another tray to be stacked up.

The upper portion of each of the engaging first-shaped protrusions and the engaging second-shaped protrusions may be tapered so that the protrusions can be easily engaged with each other.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of a tray for electronic parts according to the present invention will be described below.

Figure 7:
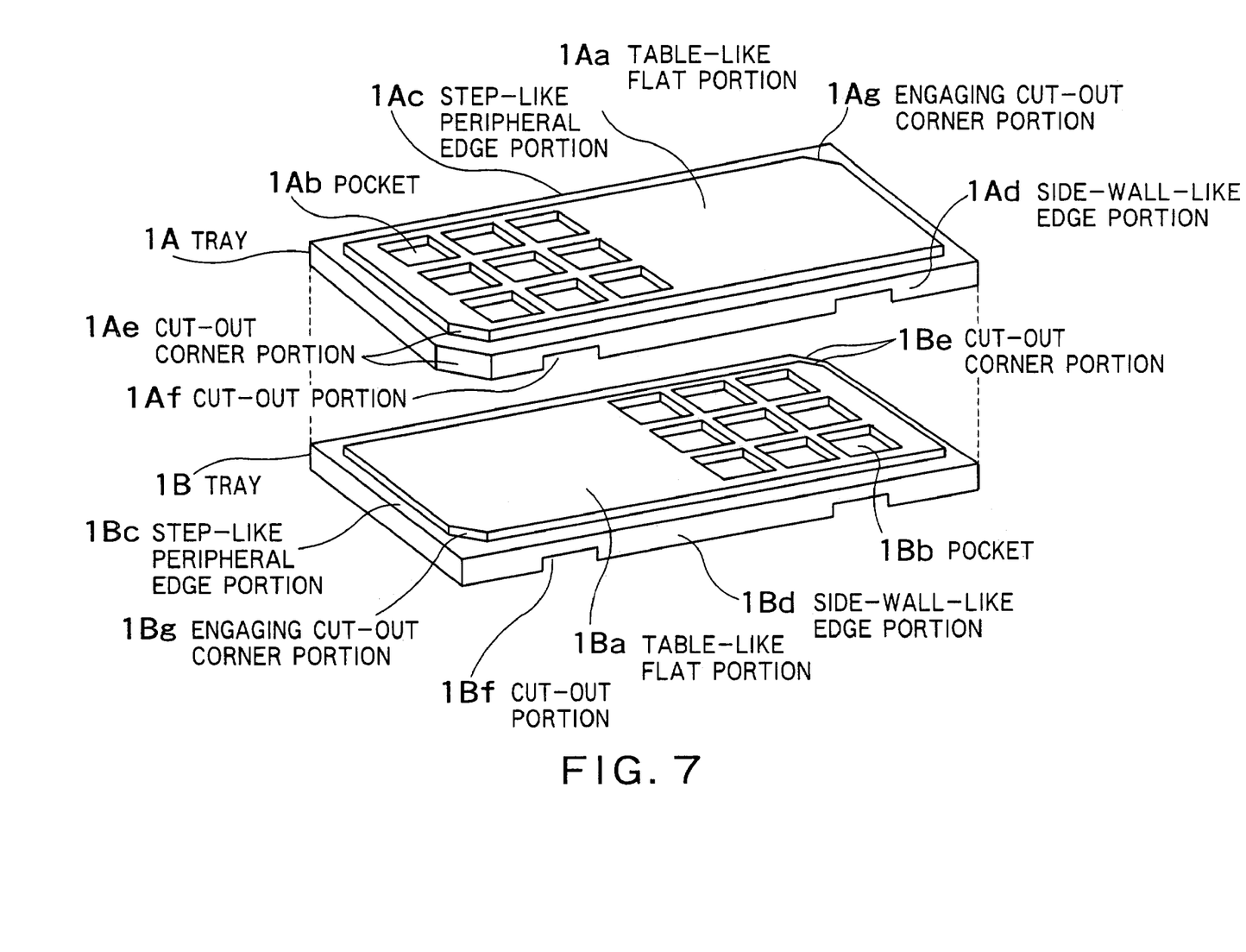
FIG. 7 is a perspective view showing the appearance of trays for electronic parts in the first preferred embodiment of the present invention.

FIG. 7 is a perspective view showing the appearance of trays for electronic parts in the first preferred embodiment of the present invention.

FIG. 7 shows first and second trays 1A and 1B for electronic parts in the first preferred embodiment of the present invention. The two trays for electronic parts in the first preferred embodiment of the present invention are shown in order to explain the feature of the first preferred embodiment of a tray for electronic parts according to the present invention. Since the first and second trays 1A and 1B for electronic parts in the first preferred embodiment of the present invention have the same structure, the structure of the first tray 1A for electronic parts will be described below.

The tray 1A for electronic parts in the first preferred embodiment of the present invention comprises: a substantially rectangular table-like flat portion 1Aa constituting a principal portion of the tray; a plurality of pockets 1Ab, each of which comprises a recessed portion formed in the table-like flat portion 1Aa so as to be adapted to the size of a corresponding one of electronic parts to be housed therein and which are arranged in the form of a matrix; a step-like peripheral edge portion 1Ac which is formed on the peripheral edge portion of the table-like flat portion 1Aa so as to allow a plurality of trays to be sequentially engaged with each other to be stacked up; a side-wall-like edge portion 1Ad which is formed on the bottom side of the step-like peripheral edge portion 1Ac so as to support thereon the table-like flat portion 1Aa and the step-like peripheral edge portion 1Ac; cut-out portions 1Af which are formed by cutting out part of the side-wall-like edge portion 1Ad so as to engage the carrying pawls of a carrying mechanism for carrying the tray; a cut-out corner portion 1Ae which is formed by cutting out one of four corner portions of each of the table-like flat portion 1Aa, the step-like peripheral edge portion 1Ac and the side-wall-like peripheral edge portion 1Ad in order to align the respective trays when the plurality of trays are sequentially engaged with each other to be stacked up; and an engaging cut-out corner portion 1Ag which is formed by cutting out a corner portion of the table-like flat portion 1Aa, which is arranged diagonally with respect to the cut-out corner portion 1Ae, so that the plurality of trays can be sequentially engaged with each other to be stacked even if the directions of the trays are opposite to each other in horizontal directions.

The tray 1A for electronic parts in the first preferred embodiment of the present invention is mainly used for housing electronic parts, such as semiconductor devices, each of which has ball terminals on its package bottom, to carry and inspect the electronic parts. In order to avoid damage to the ball terminals on the bottom of the package of electronic parts, a through hole for exposing the ball terminals to the reverse surface side of the tray is formed in the central portion of the bottom of each of the pockets 1Ab so that the peripheral edge portion of the bottom of the package of electronic parts is supported on the peripheral edge portion of the bottom of each of the pockets 1Ab. The tray 1A for electronic parts in the first preferred embodiment of the present invention is produced by injection-molding a plastic material or the like.

The first and second trays 1A and 1B for electronic parts in the first preferred embodiment of the present invention are provided with the engaging cut-out corner portions 1Ag and 1Bg which are formed by cutting the corners of the table-like flat portion 1Aa and 1Ba, which are arranged diagonally with respect to the cut-out corner portions 1Ae and 1Be, respectively. Therefore, even if the directions of the trays in horizontal directions are opposite to each other, the trays can be engaged with each other to be stacked up, so that it is possible to prevent the side-wall-like edge portions 1Ad and 1Bd of the trays from being damaged and to prevent the trays from warping.

Figure 8:
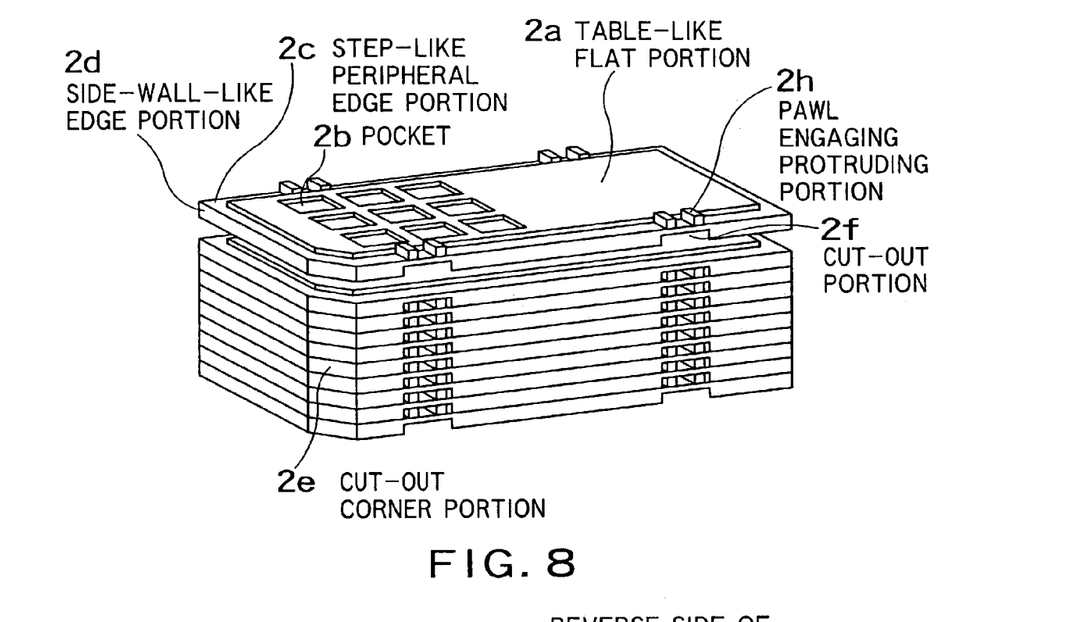
FIG. 8 is a perspective view showing a state that a plurality of trays for electronic parts in the second preferred embodiment of the present invention are sequentially engaged with each other to be stacked up.

FIG. 8 is a perspective view showing a state that a plurality of conventional trays for electronic parts in the second preferred embodiment of the present invention are sequentially engaged with each other to be stacked up.

The tray 2A for electronic parts in the second preferred embodiment of the present invention comprises: a substantially rectangular table-like flat portion 2a constituting a principal portion of the tray; a plurality of pockets 2b, each of which comprises a recessed portion formed in the table-like flat portion 2a so as to be adapted to the size of a corresponding one of electronic parts to be housed therein and which are arranged in the form of a matrix; a step-like peripheral edge portion 2c which is formed on the peripheral edge portion of the table-like flat portion 2a so as to allow a plurality of trays to be sequentially engaged with each other to be stacked up; a side-wall-like edge portion 2d which is formed on the bottom side of the step-like peripheral edge portion 2c so as to support thereon the table-like flat portion 2a and the step-like peripheral edge portion 2c; cut-out portions 2f which are formed by cutting out part of the side-wall-like edge portion 2d so as to engage the carrying pawls of a carrying mechanism for carrying the tray; a cut-out corner portion 2e which is formed by cutting out one of four corner portions of each of the table-like flat portion 2a and the step-like peripheral edge portion 2c in order to align the respective trays when the plurality of trays are sequentially engaged with each other to be stacked up; and pawl engaging protruding portions 2h which are formed on-the surface of the step-like peripheral edge portion 2c above the respective cut-out portions 2f so as to be able to engage the carrying pawls 3 of a carrying mechanism from the bottom side in a state that the trays are reversed.

The pawl engaging protruding portion 2h may have any shape if it can engage the carrying pawl 3 of the carrying mechanism. However, the pawl engaging protruding portion 2h must have such a shape that the pawl engaging protruding portion 2h of each tray can be housed in the cut-out portion 2f of a tray arranged directly above each tray when a plurality of trays are sequentially engaged with each other to be stacked.

Similar to the first tray 1A for electronic parts in the first preferred embodiment of the present invention, the tray for electronic parts in the second preferred embodiment of the present invention is mainly used for housing electronic parts, such as semiconductor devices, each of which has ball terminals on its package bottom, to carry and inspect the electronic parts. In order to avoid damage to the ball terminals on the bottom of the package of electronic parts, a through hole for exposing the ball terminals to the reverse surface side of the tray is formed in the central portion of the bottom of each of the pockets 2b so that the peripheral edge portion of the bottom of the package of electronic parts is supported on the peripheral edge portion of the bottom of each of the pockets 2b. The tray for electronic parts in the second preferred embodiment of the present invention is also produced by injection-molding a plastic material or the like.

In the second preferred embodiment of a tray for electronic parts according to the present invention, the pawl engaging protruding portions 2h are formed on the step-like peripheral edge portion 2c above the respective cut-out portions 2f. Therefore, a method for simultaneously reversing a plurality of trays in a state that the trays are sequentially engaged with each other in the same direction to be stacked up can be adopted as a method for reversing electronic parts housed in the trays in order to inspect the electronic parts, and it is possible to solve conventional problem as will be described later.

Figure 9:
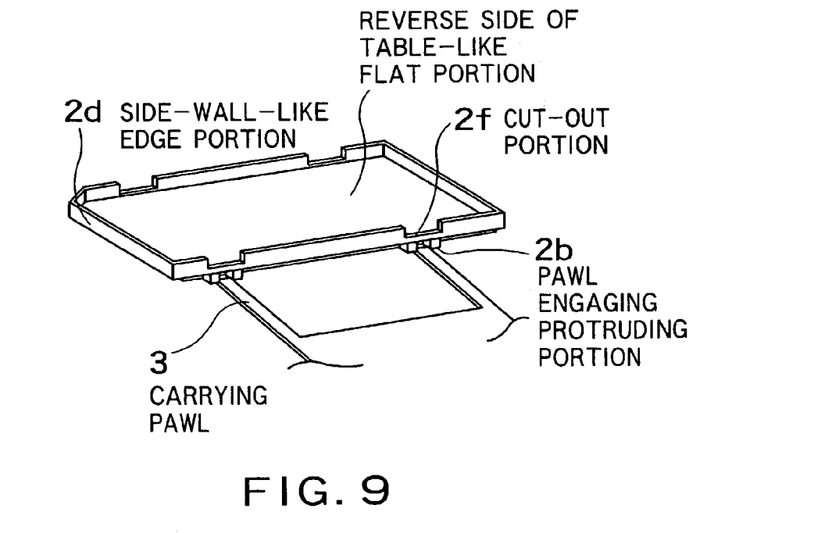
FIG. 9 is a perspective view showing a state that the second preferred embodiment of a tray for electronic parts according to the present invention is reversed to be carried by means of a carrying mechanism in a state that it is reversed.

FIG. 9 is a perspective view showing a state that the second preferred embodiment of a tray for electronic parts according to the present invention is carried by a carrying mechanism in a state that the tray is reversed.

If the method for simultaneously reversing the plurality of trays in the state that the trays are sequentially engaged with each other in the same direction to be stacked up is adopted as the method for reversing electronic parts housed in the tray in order to inspect the electronic parts, the trays must be carried one by one while being reversed as described above when the electronic parts are inspected from the reverse side after all of the trays are reversed. When the tray for electronic parts in the second preferred embodiment of the present invention are carried while being reversed, it is possible to surely carry the trays by causing the carrying pawls 3 of the carrying mechanism to engage the pawl engaging protruding portions 2h, which are formed on the step-like peripheral edge portion 2c above the respective cut-out portions 2f, from the bottom side in a state that the trays are reversed. Therefore, it is possible to prevent the trays from dropping due to side slip while the trays are carried in a state that the trays are reversed.

As described above, in the method for reversing the plurality of trays in the state that the trays are sequentially engaged with each other in the same direction to be stacked up, the electronic parts are reversed in a state that the electronic parts are housed in the pockets 7b having a depth corresponding to the height of one of the electronic parts. Therefore, it is possible to prevent the electronic parts from being inclined after reversal, and it does not take a lot of time unlike the method for repacking the electronic parts.

Figure 10:
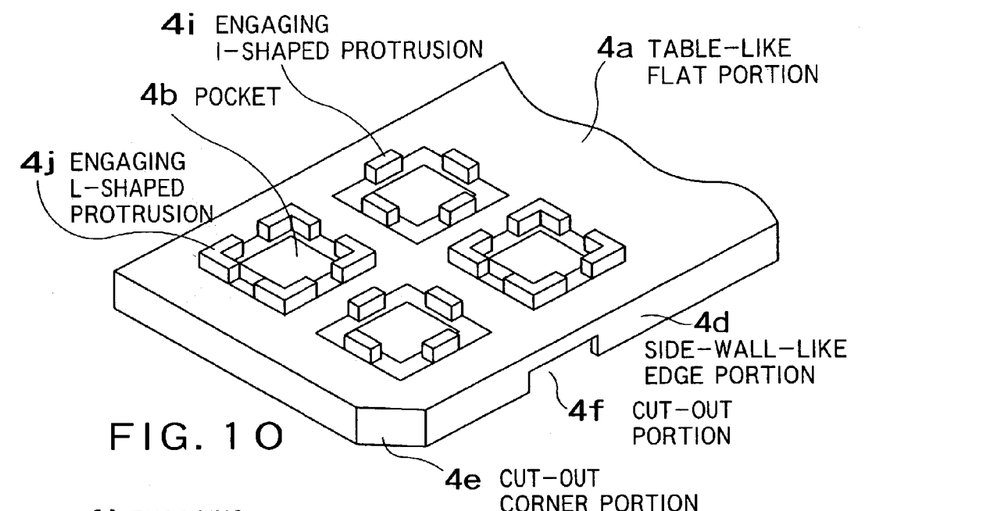
FIG. 10 is a perspective view showing the appearance of the third preferred embodiment of a tray for electronic parts according to the present invention.

FIG. 10 is a perspective view showing the appearance of the third preferred embodiment of a tray for electronic parts according to the present invention.

The tray for electronic parts in the third preferred embodiment of the present invention comprises: a substantially rectangular table-like flat portion 4a constituting a principal portion of the tray; a plurality of pockets 4b, each of which comprises a rectangular recessed portion formed in the table-like flat portion 4a so as to be adapted to the size of a range occupied by ball terminals provided on the bottom of the package of electronic parts to be housed therein and which are arranged in the form of a matrix; a side-wall-like edge portion 4d which is formed on the bottom side of the peripheral edge portion of the table-like flat portion 4a so as to support thereon the peripheral edge portion of the table-like flat portion 4a; cut-out portions 4f which are formed by cutting out part of the side-wall-like edge portion 4d so as to engage the carrying pawls of a carrying mechanism for carrying the tray; a cut-out corner portion 4e which is formed by cutting out one of four corner portions of the table-like flat portion 4a in order to align the respective trays when the plurality of trays are sequentially engaged with each other to be stacked up; engaging L-shaped protrusions 4j which are formed on four corner portions surrounding each of alternate pockets 4b in row and column directions, of the plurality of pockets 4b formed in the form of the matrix, so as to be adapted to the size of the electronic parts to be housed; and engaging I-shaped protrusions 4i which are formed at the central portion of each of four sides surrounding to pockets 4b, around which the engaging L-shaped protrusions 4j are not provided, to extend along the respective four sides so as to be adapted to the size of the electronic parts to be housed.

The tray for electronic parts in the third preferred embodiment of the present invention is also mainly used for housing electronic parts, such as semiconductor devices, each of which has ball terminals on its package bottom, to carry and inspect the electronic parts. In order to avoid damage to the ball terminals on the bottom of the package of electronic parts, the pockets 4b are provided. Therefore, the bottom of each of the pockets 4b has only to be formed so as not to contact the ball terminals on the bottom of the package of the electronic parts, so that the bottom may be formed at a sufficiently depth or a through hole may be formed without providing the bottom. The peripheral edge portion of the bottom of the package of the electronic parts is supported on the surface of the table-like flat portion 4a surrounding each of the pockets 2b, and the horizontal movement of the electronic parts is inhibited by the engaging L-shaped protrusions 4j or the engaging I-shaped protrusions 4i. The tray for electronic parts in the third preferred embodiment of the present invention is also produced by injection-molding a plastic material or the like.

Figure 11:
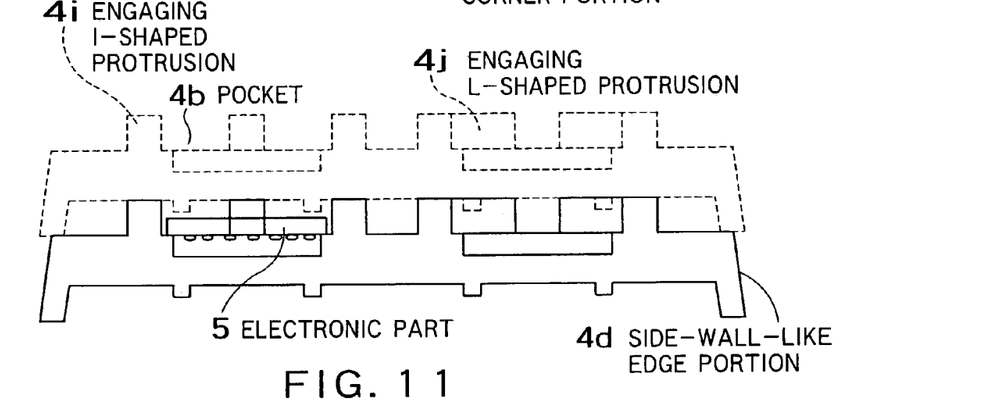
FIG. 11 is a sectional view showing a state that a plurality of trays for electronic parts in the third preferred embodiment of the present invention, in which electronic parts have been housed, are sequentially engaged with each other to be stacked up.

FIG. 11 is a sectional view showing a state that a plurality of trays in the third preferred embodiment of the present invention, in which electronic parts are housed therein, are sequentially engaged with each other to be stacked up.

Electronic parts 5, each of which has the ball terminals 5a on its package bottom, are housed in the respective pockets so that the ball terminals 5a are directed toward the bottom of the tray. The respective trays are sequentially engaged with each other to be stacked up so that the side-wall-like edge portion 4d of each tray is mounted on the peripheral edge portion of the table-like flat portion 4a of a tray arranged directly below each tray. The plurality of trays in the third preferred embodiment of the present invention are simultaneously carried in a state that the plurality of trays are sequentially engaged with each other to be stacked up.

Figure 12:
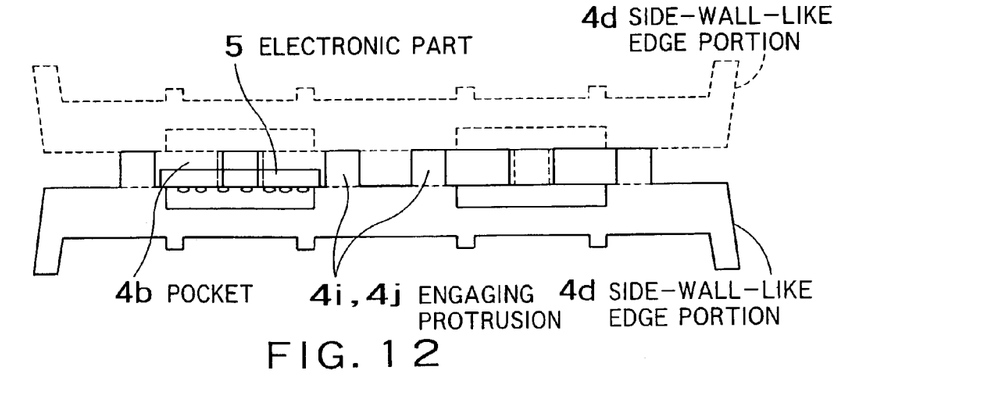
FIG. 12 is a sectional view showing a state that two trays for electronic parts in the third preferred embodiment of the present invention are stacked up so that their table-like flat portion 4a face each other.

FIG. 12 is a sectional view showing a state that two trays for electronic parts in the third preferred embodiment of the present invention are stacked up so that the table-like flat portions 4a of the trays face each other in order to reverse electronic parts when the electronic parts housed in the tray for electronic parts in the third preferred embodiment of the present invention are inspected from the reverse side.

The most characteristic point of the tray for electronic parts in the third preferred embodiment of the present invention is that the above described engaging L-shaped protrusions 4j and engaging I-shaped protrusions 4i are provided. Therefore, when the tray for electronic parts in the third preferred embodiment of the present invention is used for stacking an empty tray on the other tray, in which electronic parts have been housed, so that the top face of the empty tray faces the top face of the other tray, the engaging L-shaped protrusion 4*j* of one tray engages the other engaging I-shaped protrusion 4*i* of the other tray, so that the depth of each of the pockets 4*b* remains being a depth corresponding the height of one of the electronic parts. Therefore, when the electronic parts housed in the respective pockets of one tray are reversed to be simultaneously moved to an empty tray by simultaneously reversing the two trays which are stacked up to be engaged with each other, it is possible to prevent the electronic parts from remaining being inclined in the pockets. As a result, it is possible to prevent the electronic parts from being damaged, and it is possible to prevent defectives from being erroneously determined.

The shapes of the engaging L-shaped protrusion 4*j* and engaging I-shaped protrusion 4*i* should hot be limited to L and I shapes, respectively, but they may be any shapes if one protrusion engages the other protrusion. However, the shapes of these protrusions must be shapes capable of preventing the movement of electronic parts housed in the pockets 4*b*. If the upper portions of both protrusions are tapered, both protrusions can be easily engaged with each other.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A tray for electronic parts comprising:
   a substantially rectangular table-like flat portion constituting a principal portion of the tray;
   a plurality of pockets, each of which comprises a rectangular recessed portion formed in said table-like flat portion so as to be adapted to the size of a range occupied by ball terminals provided on the bottom of the package of electronic parts to be housed therein and which are arranged in the form of a matrix;
   a side-wall-like edge portion which is formed on the bottom side of a peripheral edge portion of said table-like flat portion so as to support thereon the peripheral edge portion of said table-like flat portion;
   a cut-out portion which is formed by cutting out a part of said side-wall-like edge portion so as to engage a carrying pawl of a carrying mechanism for carrying the tray;
   a cut-out corner portion which is formed by cutting out one of four corner portions of said table-like flat portion in order to align the respective trays when the plurality of trays are sequentially engaged with each other to be stacked up;
   engaging first-shaped protrusions, each of which has a first shape and which are formed around each of alternate pockets in row and column directions, of said plurality of pockets formed in the form of the matrix, so as to be adapted to the size of a corresponding one of said electronic parts to be housed; and
   engaging second-shaped protrusions, each of which has a second shape and which are formed around each of pockets, around which said engaging first-shaped protrusions are not provided, so as to be adapted to the size of a corresponding one of said electronic parts to be housed, so as to engage said engaging first-shaped protrusions when said table-like flat portion of the tray faces the table-like flat portion of another tray to be stacked up.

2. A tray for electronic parts as set forth in claim 1, wherein an upper portion of each of said engaging first-shaped protrusions and said engaging second-shaped protrusions is tapered.

3. A tray for electronic parts as set forth in claim 1, wherein said engaging first-shaped protrusions are engaging L-shaped protrusions which are formed on four corner portions surrounding each of alternate pockets in row and column directions, of said plurality of pockets formed in the form of the matrix, so as to be adapted to the size of a corresponding one of said electronic parts to be housed; and
   said engaging second-shaped protrusions are engaging I-shaped protrusions which are formed at the central portion of each of four sides surrounding to pockets, around which said engaging L-shaped protrusions are not provided, to extend along the respective four sides and which are adapted to the size of a corresponding one of said electronic parts to be housed, so as to engage said engaging L-shaped protrusions when said table-like flat portion of the tray faces the table-like flat portion of another tray to be stacked up.

4. A tray for electronic parts as set forth in claim 3, wherein an upper portion of each of said engaging first-shaped protrusions and said engaging second-shaped protrusions is tapered.

* * * * *